US009269371B2

(12) United States Patent
Principe et al.

(10) Patent No.: US 9,269,371 B2
(45) Date of Patent: Feb. 23, 2016

(54) ADAPTIVE SYSTEMS USING CORRENTROPY

(75) Inventors: Jose Carlos Principe, Gainesville, FL (US); Abhishek Singh, Champaign, IL (US); Weifeng Liu, Issaquah, WA (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 497 days.

(21) Appl. No.: 13/578,358

(22) PCT Filed: Feb. 11, 2011

(86) PCT No.: PCT/US2011/024435
§ 371 (c)(1),
(2), (4) Date: Oct. 30, 2012

(87) PCT Pub. No.: WO2011/100491
PCT Pub. Date: Aug. 18, 2011

(65) Prior Publication Data
US 2013/0211829 A1     Aug. 15, 2013

Related U.S. Application Data

(60) Provisional application No. 61/303,751, filed on Feb. 12, 2011.

(51) Int. Cl.
*G10L 21/02*     (2013.01)
*G10L 21/0264*   (2013.01)
*H03H 21/00*     (2006.01)

(52) U.S. Cl.
CPC ........ *G10L 21/0264* (2013.01); *H03H 21/0043* (2013.01)

(58) Field of Classification Search
USPC .................................................. 704/226, 233
See application file for complete search history.

(56) References Cited

U.S. PATENT DOCUMENTS 5,157,596 A     10/1992  Alcone
5,943,661 A *    8/1999  Katz .............................. 706/16
(Continued)

FOREIGN PATENT DOCUMENTS

WO    WO 2007/053831 A2 *  5/2007  .............. G10L 19/00

OTHER PUBLICATIONS

Singh et al.; Using as a Cost Function in Linear Adaptive Filters; Proceedings of International Joint Conference on Neural Networks, Atlanta, Georgia, USA, Jun. 14-19, 2009; pp. 2950-2955.*
(Continued)

*Primary Examiner* — Abul Azad
(74) *Attorney, Agent, or Firm* — Wolf, Greenfield & Sacks, P.C.

(57) ABSTRACT

Various methods and systems are provided for related to adaptive systems using correntropy. In one embodiment, a signal processing device includes a processing unit and a memory storing an adaptive system executable in the at least one processing unit. The adaptive system includes modules that, when executed by the processing unit, cause the signal processing device to adaptively filter a desired signal using a correntropy cost function. In another embodiment, a method includes adjusting a coefficient of an adaptive filter based at least in part on a correntropy cost function signal, providing an adaptive filter output signal based at least in part on the adjusted coefficient and a reference signal, and determining an error signal based at least in part on a received signal and the adaptive filter output signal.

21 Claims, 10 Drawing Sheets

(56) References Cited

U.S. PATENT DOCUMENTS

| | | |
|---|---|---|
| 5,974,434 A | 10/1999 | Rose |
| 2008/0293372 A1 | 11/2008 | Principe et al. |
| 2009/0111507 A1* | 4/2009 | Chen .......................... 455/550.1 |
| 2009/0203343 A1* | 8/2009 | Principe et al. ............... 455/307 |
| 2010/0197258 A1* | 8/2010 | Principe et al. ............ 455/226.1 |

OTHER PUBLICATIONS

International Search Report and Written Opinion dated Sep. 30, 2011.

* cited by examiner

US 9,269,371 B2

ADAPTIVE SYSTEMS USING CORRENTROPY

CROSS REFERENCE TO RELATED APPLICATIONS

This application is the 35 U.S.C. §371 national stage of PCT application PCT/US2011/024435, filed Feb. 11, 2011, which claims priority to and the benefit of U.S. provisional application entitled "ROBUST TRAINING OF ADAPTIVE SYSTEMS USING CORRENTROPY" having Ser. No. 61/303,751, filed Feb. 12, 2010, both of which are hereby incorporated by reference in their entirety.

STATEMENT REGARDING FEDERALLY SPONSORED RESEARCH OR DEVELOPMENT

This invention was made with government support under agreement ECS-0601271 awarded by the National Science Foundation. The Government has certain rights in the invention.

BACKGROUND

Adaptive filters are used in a wide range of signal processing applications. While a least means square (LMS) adaptive algorithm can be used to adapt a filter by minimizing the mean squared value (second order moment) of the error between the output of the adaptive filter and the desired response, the performance of such adaptive filters can be limited when operating under impulsive noise conditions.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
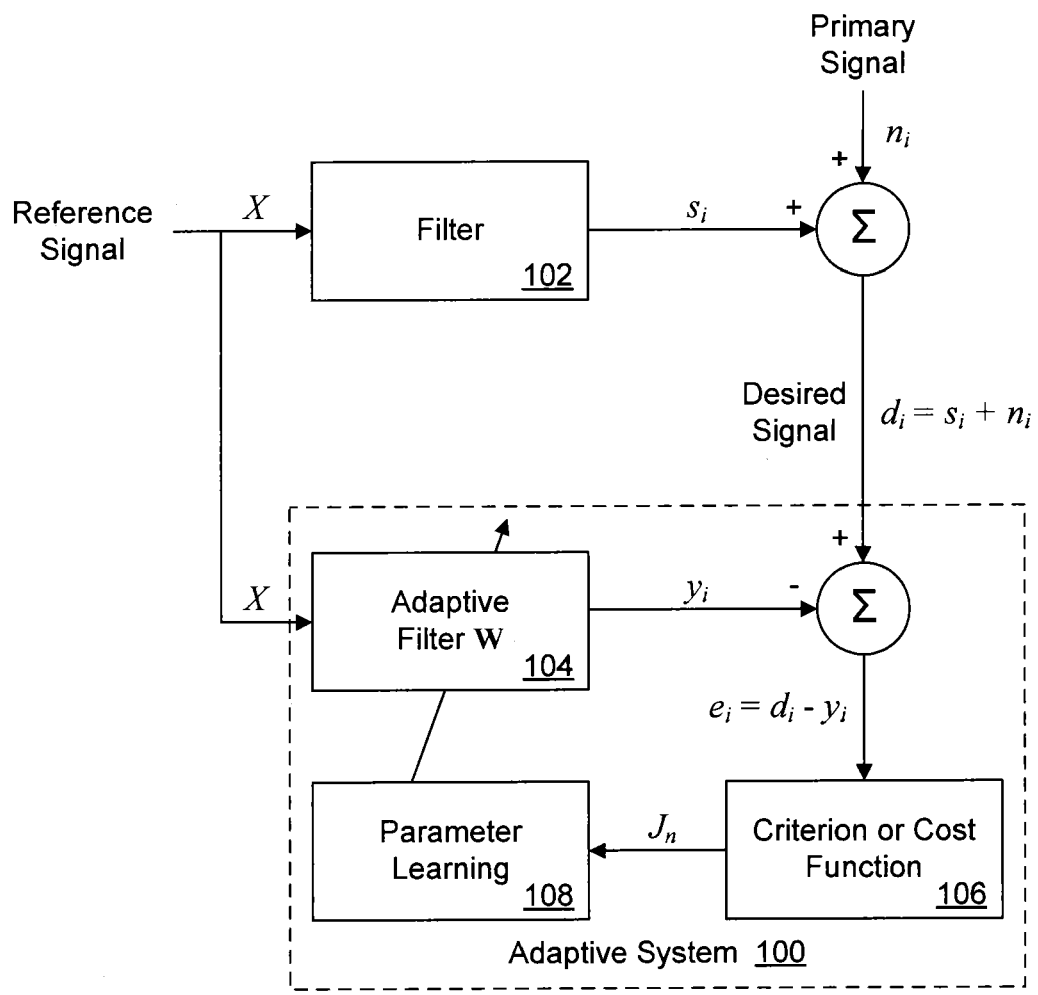
FIGS. 1 and 2 are block diagrams of examples of adaptive systems in accordance with various embodiments of the present disclosure.

Disclosed herein are various embodiments of systems and methods related to adaptive systems using correntropy. Reference will now be made in detail to the description of the embodiments as illustrated in the drawings, wherein like reference numbers indicate like parts throughout the several views.

The present disclosure describes various embodiments using a correntropy cost function for training of adaptive systems. Adaptive systems are useful in a variety of signal processing applications such as channel equalization, noise cancellation, system modeling, etc. For example, adaptive systems may be used in communication devices such as, but not limited to, cellular telephones, headphones, and other devices utilizing noise cancellation and/or equalization. An adaptive system that implements a correntropy cost function may be useful in reducing the detrimental effects of outliers and impulsive noise. In particular, because correntropy is a localized measure as opposed to a global measure, a correntropy cost function in an adaptive system is useful for reducing the detrimental effects of non-Gaussian noise.

Correntropy is a localized similarity measure between two arbitrary scalar random variables X and Y, and correntropy is a function of higher order moments of the difference between the random variables. Correntropy is defined by:

$$V_\sigma(X,Y) = E[\kappa_\sigma(X-Y)] \qquad \text{EQ. (1)}$$

where $\kappa_\sigma(\cdot)$ is a positive definite kernel. Accordingly, correntropy is a measure of the similarity of two random variables within a small neighborhood determined by the kernel width (or size).

In practice, only a finite number of samples $\{(x_i, y_i)\}$ of the variables X and Y are available (i=1, N). Accordingly, the sample estimator for the expectation operator is expressed as:

$$\hat{V}_{N,\sigma}(X, Y) = \sum_{i=1}^{N} \kappa_\sigma(x_i - y_i) \qquad \text{EQ. (2)}$$

where $\kappa_\sigma(\cdot)$ is assumed to be a Gaussian function (also called the kernel) with a standard deviation $\sigma$, which is also called the kernel bandwidth or kernel size. Using a Taylor series expansion of the exponential function in the Gaussian kernel and substituting in EQ. (1), the sample estimator for the expectation operator may also be expressed as:

$$\hat{V}_\sigma(X, Y) = \frac{1}{\sqrt{2\pi}\,\sigma} E\left[\exp\left(\frac{-(X-Y)^2}{2\sigma^2}\right)\right] \qquad \text{EQ. (3)}$$

$$\hat{V}_\sigma(X, Y) = \frac{1}{\sqrt{2\pi}\,\sigma} \sum_{n=0}^{\infty} \frac{(-1)^n}{2^n n!} E\left[\frac{(X-Y)^{2n}}{\sigma^{2n}}\right] \qquad \text{EQ. (4)}$$

As can be seen above, correntropy may be viewed as a correlation function between two random variables, containing higher (even) order moments of the error (X−Y) between the two random variables, within a small neighborhood determined by the kernel width (or size).

In contrast, adaptive systems implementing a mean squared error (MSE) technique (i.e., minimizing the MSE between a desired signal and the filter output) can provide a global measure. Yet, such second-order statistical techniques are applicable only when the distribution of error is Gaussian. In other practical scenarios, errors may be non-Gaussian such as filtering under impulsive noise conditions, or noise cancellation in speech signals, which are typically heavy-tailed. A measure based on just second order statistics, like MSE, can easily become biased under such conditions. However, the localization provided by the kernel width in the correntropy calculation may be useful in reducing the detrimental effects of outliers and impulsive noise.

Turning now to FIG. 1, shown is a block diagram of an embodiment of an adaptive system 100. The adaptive system 100 is configured to learn the parameters of a filter 102, which are unknown, by exploiting a correntropy measure between a primary input (or the desired signal) and the output of the filter 102. The adaptive system 100 implements a cost function 106 (i.e., criterion function), a parameter learning 108, and an adaptive filter 104 including a set of filter weights W. As illustrated in FIG. 1, the filter 102 and the adaptive filter 104 each receive a reference signal X. The filter 102 outputs a filtered reference signal $s_i$, which is based at least in part on the reference signal X.

The filtered reference signal $s_i$ is added to a primary signal $n_i$, and the sum of the filtered reference signal $s_i$ and the primary signal $n_i$ is equal to the desired signal $d_i$. The adaptive filter 104 outputs an adaptively-filtered reference signal $y_i$, which is based at least in part on the reference signal X. The adaptively filtered reference signal $y_i$ is subtracted from the desired signal $d_i$, yielding an error signal $e_i$. The error signal $e_i$ is applied to the cost function 106, which outputs a cost function signal $J_n$.

The cost function signal $J_n$ is received by the parameter learning 108, which adjusts the adaptive filter 104 based at least in part on the cost function signal $J_n$ and/or the error signal $e_i$. The adaptive system 100 is configured to optimize the cost function signal $J_n$ in such a way that the output of the adaptive filter 104 resembles the desired signal $d_i$. For example, the cost function signal $J_n$ may be considered optimized when comparison to a threshold meets predefined criterion (e.g., when $J_n$ is at and/or below the threshold).

The cost function signal $J_n$ is defined to be equal to the correntropy between the desired signal $d_i$ and the filter output $y_i$. In this example, a normalized Gaussian kernel is used to compute correntropy.

$$J_n = \frac{1}{\sqrt{2\pi}\,\sigma} \cdot \frac{1}{N} \sum_{i=n-N+1}^{n} \exp\left(\frac{-(d_i - y_i)^2}{2\sigma^2}\right) \qquad \text{EQ. (5)}$$

If the filter weights at the nth time instant are $W_n$, the cost function signal $J_n$ may be written as:

$$J_n = \frac{1}{\sqrt{2\pi}\,\sigma} \cdot \frac{1}{N} \sum_{i=n-N+1}^{n} \exp\left(\frac{-(d_i - W_n^T x_i)^2}{2\sigma^2}\right) \qquad \text{EQ. (6)}$$

Analytically, it is challenging to determine the set of filter weights $W_n$, which can maximize the cost function signal $J_n$. Therefore, an iterative gradient ascent approach is used where the next set of filter weights W of the adaptive filter 104 are determined by taking a small step $\mu$ along the positive gradient of the cost function $J_n$ in the weight space. The step size $\mu$ is chosen according to the application, but the theory of gradient descent states that it has an upper bound which is determined by the largest eigenvalue of the input autocorrelation matrix. Therefore, $$W_{n+1} = W_n + \mu \nabla J_n \qquad \text{EQ. (7)}$$

Substituting the cost function signal $J_n$ and computing the gradient with respect to $W_n$, the next set of filter weights may be expressed as:

$$W_{n+1} = W_n + \frac{\mu}{\sqrt{2\pi}\,\sigma^3} \cdot \frac{1}{N} \sum_{i=n-N+1}^{n} \left[\exp\left(\frac{-e_n^2}{2\sigma^2}\right) e_i X_i\right] \qquad \text{EQ. (8)}$$

where $e_i = d_i - W_n^T X_i$. Approximating the sum by the current value (N=1) inspired by the stochastic gradient, the maximum correntropy criterion (MCC) update equation is:

$$W_{n+1} = W_n + \frac{\mu}{\sqrt{2\pi}\,\sigma^3} \exp\left(\frac{-e_n^2}{2\sigma^2}\right) e_n X_n \qquad \text{EQ. (9)}$$

The weight update equation using the correntropy cost function has therefore been reduced to a simple form, as can be seen above.

For purposes of comparison with the MCC update equation, the LMS weight update is presented below:

$$W_{(n+1)}^{LMS} = W_n^{LMS} + \mu e_n X_n \qquad \text{EQ. (10)}$$

As can be seen above, each iteration in EQ. (9) includes an extra scaling factor which is an exponential function of the value of the error signal $e_i$ in that iteration. This scaling factor reflects the outlier rejection property of the correntropy similarity measure. Therefore, the adaptation of weights using a MCC cost function is expected to be more stable if the desired signal $d_i$ has strong outliers or impulsive characteristics. This robustness comes at almost no greater algorithmic complexity than a least means square (LMS) algorithm.

An additional aspect of EQ. (9) is the correntropy kernel width, which is dependent on the input signal. From the definition of correntropy, the kernel width defines the amplitude scale within which the similarity of the two random variables is computed. Using in the correntropy measure a very large kernel size much larger than the variance of the error will therefore yield a similarity measure close to MSE value. A small value of kernel size, of the order of the error $e_i$, variance will be useful for exploiting the properties of a correntropy measure. The Silverman's rule of thumb of density estimation is appropriate to select the kernel size.

Figure 2:
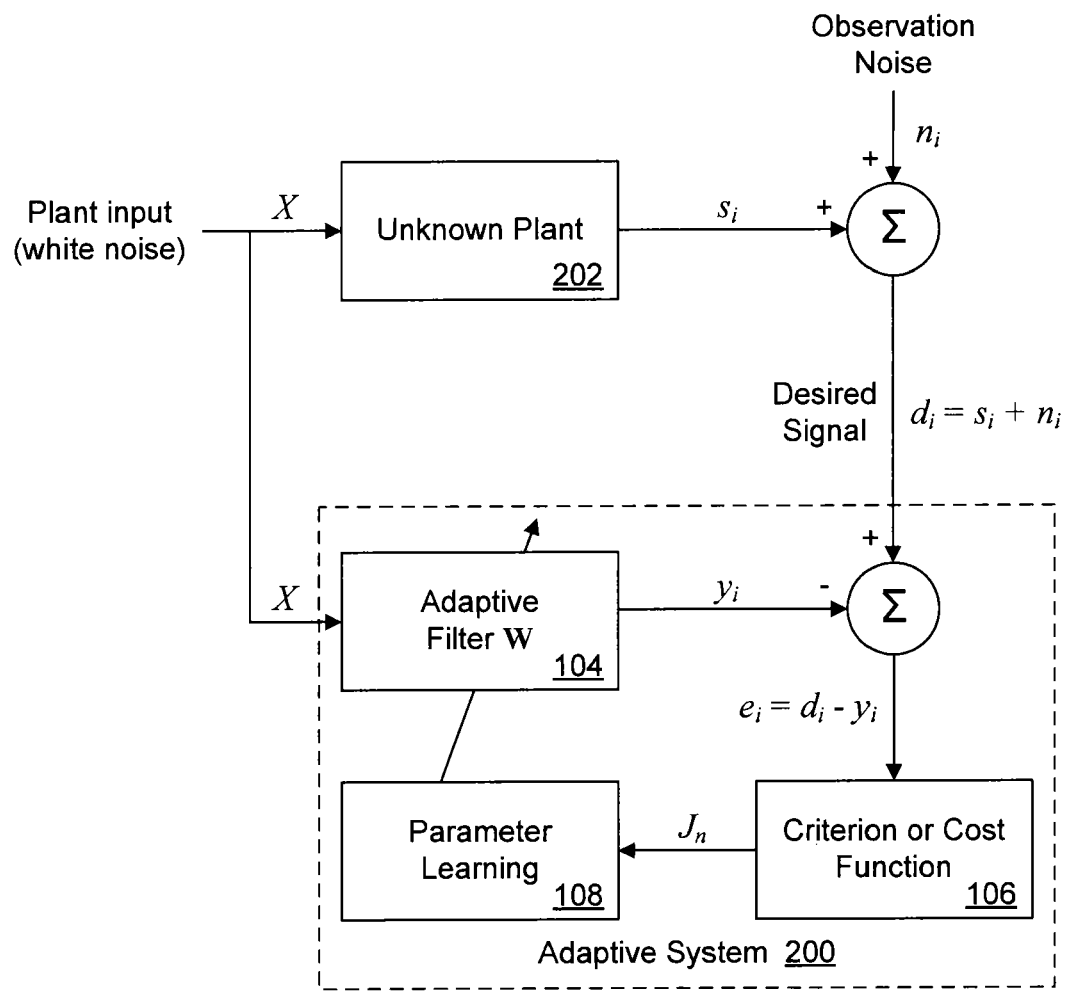

Turning now to FIG. 2, shown is a block diagram of an embodiment of an adaptive system 200 configured to identify a system. Identifying a system involves determining the coefficients of an unknown filter by studying its response to a white input signal. An unknown system, such as unknown plant 202, is modeled by the adaptive filter 104 in such a way that for the same input, the difference between the outputs of the unknown plant 202 and the adaptive filter 104 is minimized. The adaptation is complicated by the presence of observation noise, which is added to the output of the unknown plant 202. The difference may be considered minimized when comparison of the cost function signal $J_n$ to a threshold meets predefined criterion (e.g., when $J_n$ is at and/or below the threshold). In some embodiments, the transfer function of the unknown plant 202 changes with time and may be tracked by the adaptive filter 104. The model provided by the adaptive filter 104 may be used in controlling the unknown plant 202. In the configuration illustrated in FIG. 2, the input (X) to the unknown plant 202 and to the adaptive filter 104 is a white Gaussian signal (white noise) with a zero mean and unit variance.

Figure 3:
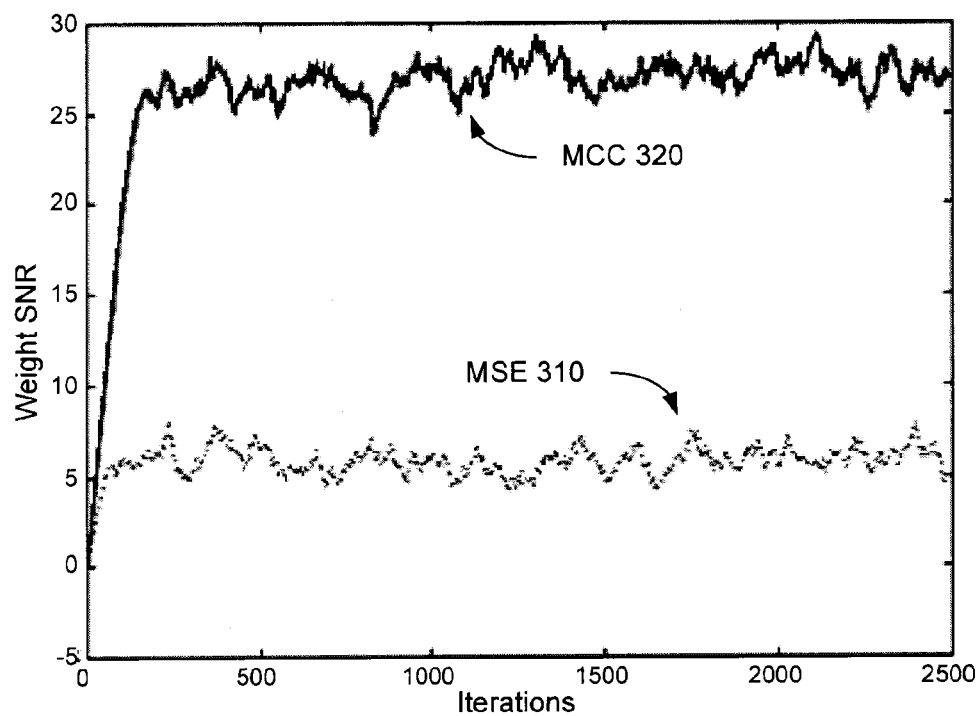
FIG. 3 is a graphical representation illustrating a non-limiting example of a comparison of the weight signal-to-noise ratio (SNR) of an adaptive system of FIG. 2 using mean squared error (MSE) and maximum correntropy criterion (MCC) in the presence of impulsive measurement noise in accordance with various embodiments of the present disclosure.
Figure 4:
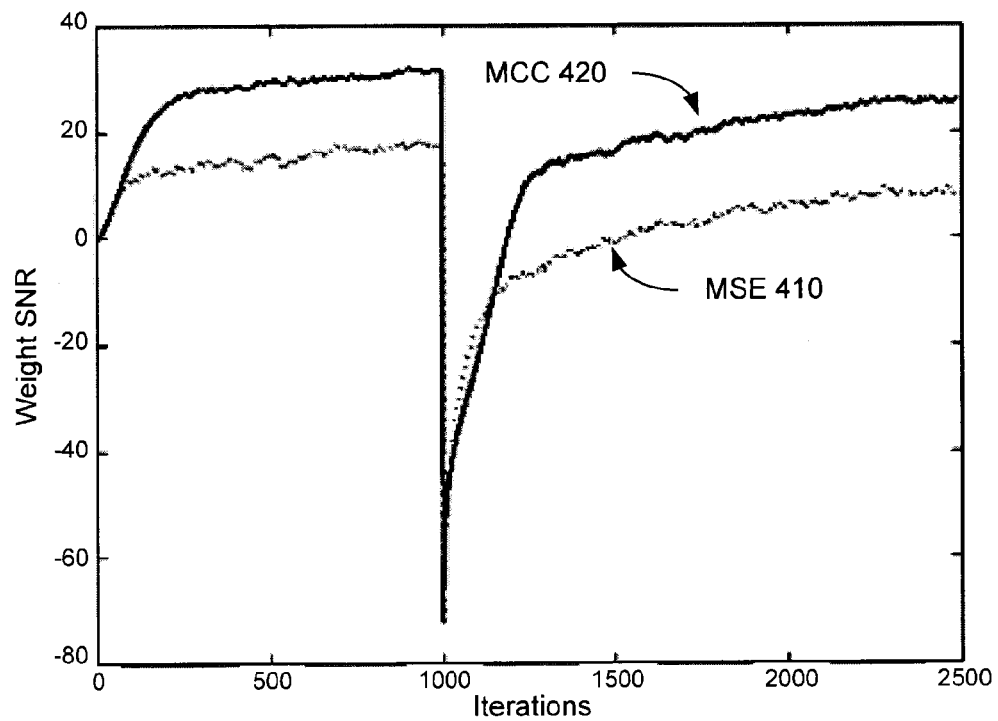
FIG. 4 is a graphical representation illustrating a non-limiting example of a weight SNR of an adaptive system of FIG. 2 using MSE and MCC while tracking a time varying system in the presence of impulsive observation noise in accordance with various embodiments of the present disclosure.

Experimental differences between the adaptive system 200 (FIG. 2) including a MCC cost function with respect to an adaptive system including an MSE cost function are illustrated in FIGS. 3 and 4. Specifically, FIG. 3 illustrates a non-limiting example of a comparison of the weight signal-to-noise ratio (SNR) of MSE 310 and MCC 320 in impulsive measurement noise, each of which is graphically depicted with respect to the number of iterations. For FIG. 3, the parameters of the experiment are defined as follows. The coefficients of the unknown plant 202 of the adaptive system 200 are defined to be:

$$W^* = [0.1, 0.2, 0.3, 0.4, 0.5, 0.4, 0.3, 0.2, 0.1]^T \quad \text{EQ. (11)}$$

Further, the impulsive observation noise is simulated using a mixture of Gaussian distributions:

$$0.95 N(0, 10^{-4}) + 0.05 N(0, 10) \quad \text{EQ. (12)}$$

Note that the Gaussian component N(0,10) creates strong outliers. Further, the kernel size for the MCC cost function is set to 2 for this case (in general, it should be a fraction of the variance of the expected outliers). A very high kernel size (e.g., more than 5 in this example) would make the correntropy cost function behave similar to the MSE cost function, while a very low step size (e.g., less than 0.5 in this example) would slow the adaptation. The step sizes for the two update equations (EQS. (9) and (10)) are such that when the observation noise is Gaussian, their performance is similar in terms of the weight SNR (WSNR), as calculated below.

$$WSNR = 10 \log_{10} \left( \frac{W^{*T} W^*}{(W^* - W_n)^T (W^* - W_n)} \right) \quad \text{EQ. (13)}$$

As can be seen in FIG. 3, when adaptation is performed in the presence of impulsive noise (e.g., EQ. (12)), there is a significant difference in performance between the MSE cost function and the MCC cost function. Whenever a high amplitude outlier is encountered in the desired signal $d_i$ (or in the error signal $e_i$) of FIG. 2, a LMS weight update equation corresponding to the MSE cost function will be forced to make a large increment, which takes the weights away from the true values. The overall effect of several such outliers is that the adaptive filter weights W keep jittering around the optional values, and exhibit noisy weight tracks as illustrated in by the MSE weight SNR 310 of FIG. 3. In contrast, the MCC weight tracks are more robust in such situations. Referring back to the MCC update equation (see EQ. (9) above), the exponential function of the error signal $e_i$ provides stability when high amplitude outliers are encountered, keeping the overall weight track close to the optimal as illustrated in by the higher MCC weight SNR 320 of FIG. 3.

Additionally, FIG. 4 illustrates a non-limiting example of a weight SNR of MSE 410 and a weight SNR of MCC 420 while tracking a time varying system in the presence of impulsive observation noise (e.g., EQ. (12)). Instead of the weights of EQ. (11), a time-varying transfer function of the unknown plant 202 was used in FIG. 4, where the coefficients varied as follows:

$$W_n^* = 2\left(1 + \frac{n}{1000}\right) u(1000 - n) W^* + \left(-1 + \frac{n}{1000}\right) u(n - 1000) W^* \quad \text{EQ. (14)}$$

where $u(\cdot)$ is the unit step function. As can be seen by comparing the weight SNR of MSE 410 and the weight SNR of MCC 420 in FIG. 4, the performance of the adaptive system 200 including the MCC cost function is better than performance of an adaptive system including an MSE cost function.

Figure 5:
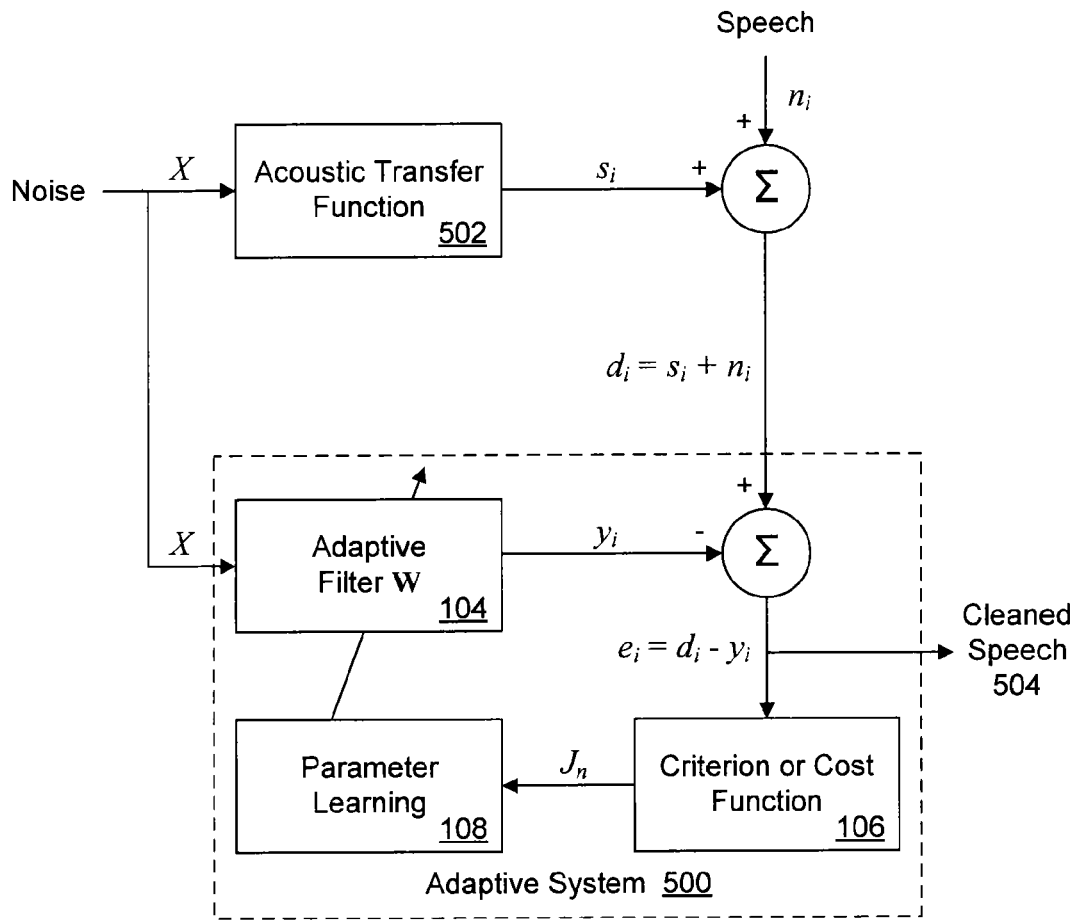
FIG. 5 is a block diagram of another example of an adaptive system in accordance with various embodiments of the present disclosure.

Moving now to FIG. 5, shown is a block diagram of an embodiment of an adaptive system 500 configured to cancel acoustic noise. Given a desired signal $n_i$ (e.g., speech, music, etc.) corrupted by an acoustic noise signal $s_i$ (e.g., ambient noise in a room), an adaptive filter 104 tries to replicate the acoustic noise signal $s_i$ by modeling the acoustic transfer function 502 between the noise source and the noise $s_i$ contained in the desired signal $d_i$. In practical scenarios, both the noise and the acoustic transfer function 502 may be non-stationary. The difference between the desired signal $d_i$ and the output signal $y_i$ of the adaptive filter 104 is in fact the noise-free signal (cleaned speech) 504.

Figure 6:
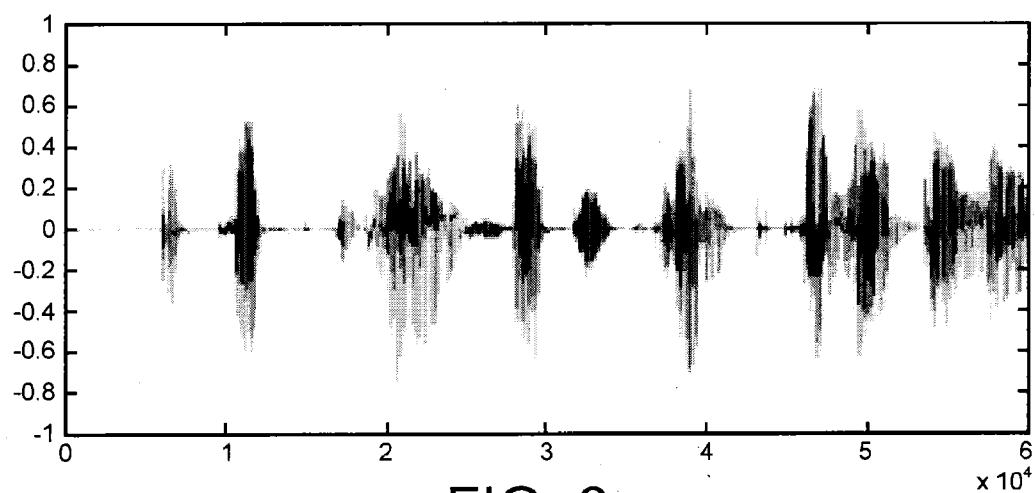
FIGS. 6-8 are graphical representations illustrating non-limiting examples of a speech signal, a noise signal, and an acoustic transfer function of FIG. 5 in accordance with various embodiments of the present disclosure.
Figure 7:
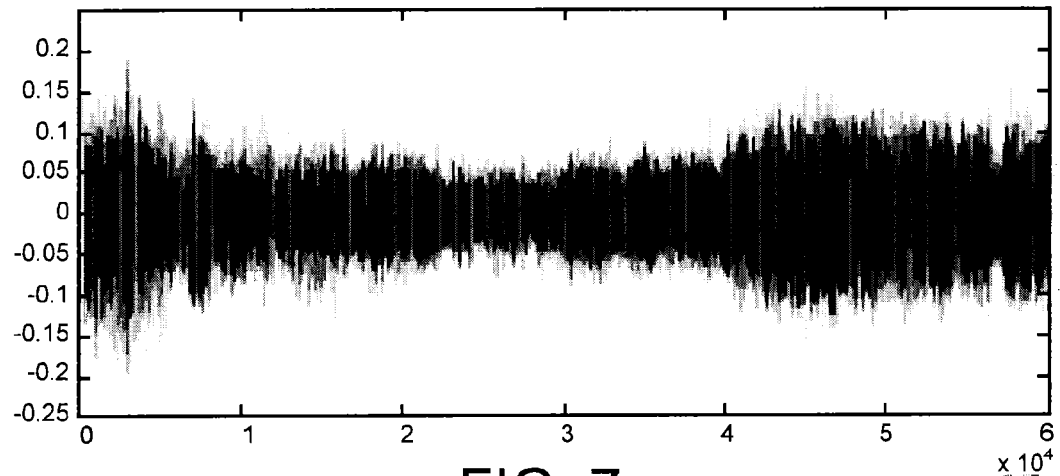
Figure 8:
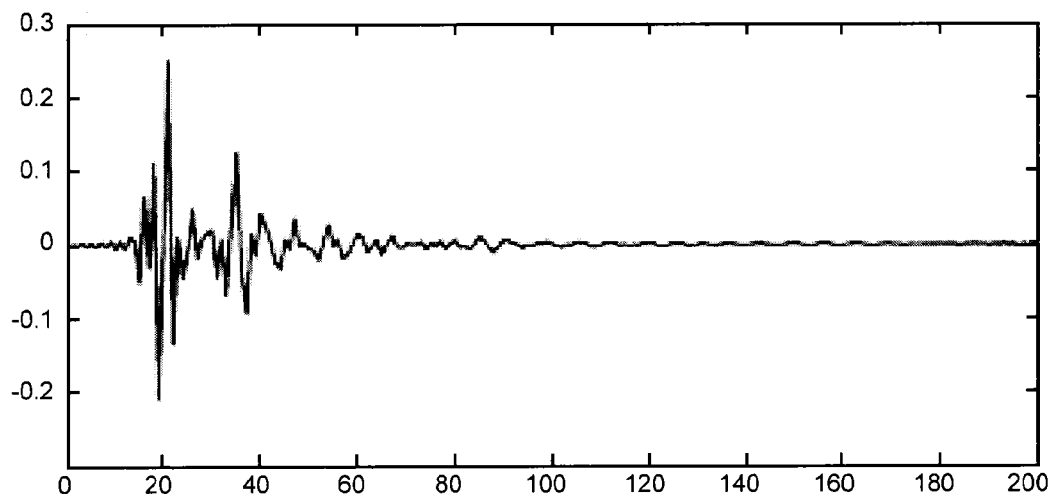

Experimental results corresponding to the adaptive system 500 configured to cancel acoustic noise are discussed below. FIG. 6 illustrates a non-limiting example of a speech signal $n_i$, and FIG. 7 illustrates a non-limiting example of a noise signal X, which is the sound of a vacuum cleaner in use and has non-stationary characteristics. The acoustic transfer function 502 may correspond to a typical closed room environment for the experiment. FIG. 8 illustrates a non-limiting example of an acoustic transfer function 502 of a small closed room using a 200 tap filter to model the acoustic path.

Figure 9:
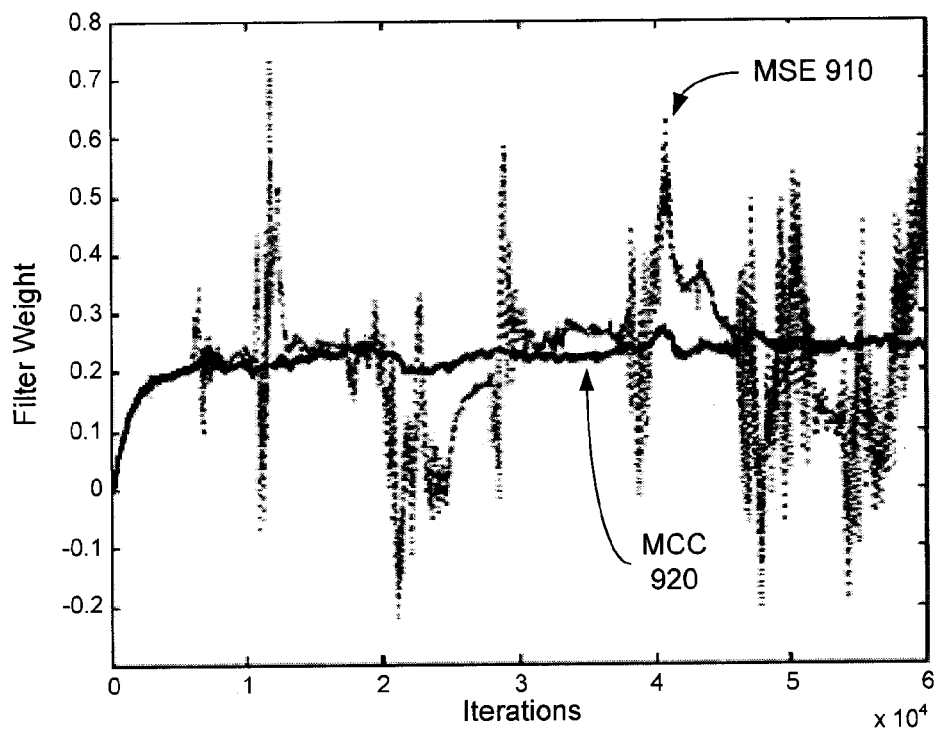
FIG. 9 is a graphical representation illustrating a non-limiting example of the weight tracks of one of the filter weights of an adaptive system of FIG. 5 based upon the conditions illustrated in FIGS. 6-8 in accordance with various embodiments of the present disclosure.

FIG. 9 shows a non-limiting example of the weight tracks of one of the filter weights based upon the conditions illustrated in FIGS. 6-8. Further, the rate of convergence was set to be the same for the adaptive system including the MSE cost function and the adaptive system 500 (FIG. 5) including the MCC cost function. As can be seen by comparing the MSE filter weight track 910 and the MCC filter weight track 920 in FIG. 9, the MSE cost function produced a much higher misadjustment at steady state than the MCC cost function. This is because of the highly impulsive nature of the speech signal $n_i$. The sudden, high amplitude "bursts" of samples which occur in speech signals $n_i$ can easily disturb the MSE weight track 910. However, since correntropy is a localized comparison measure, the MCC cost function places exponentially decreasing weights on samples that are distant and impulsive. Therefore, the steps and the overall weight track 920 of the MCC cost function are much less affected by such types of non-stationarities in the desired signal $d_i$.

Figure 10:
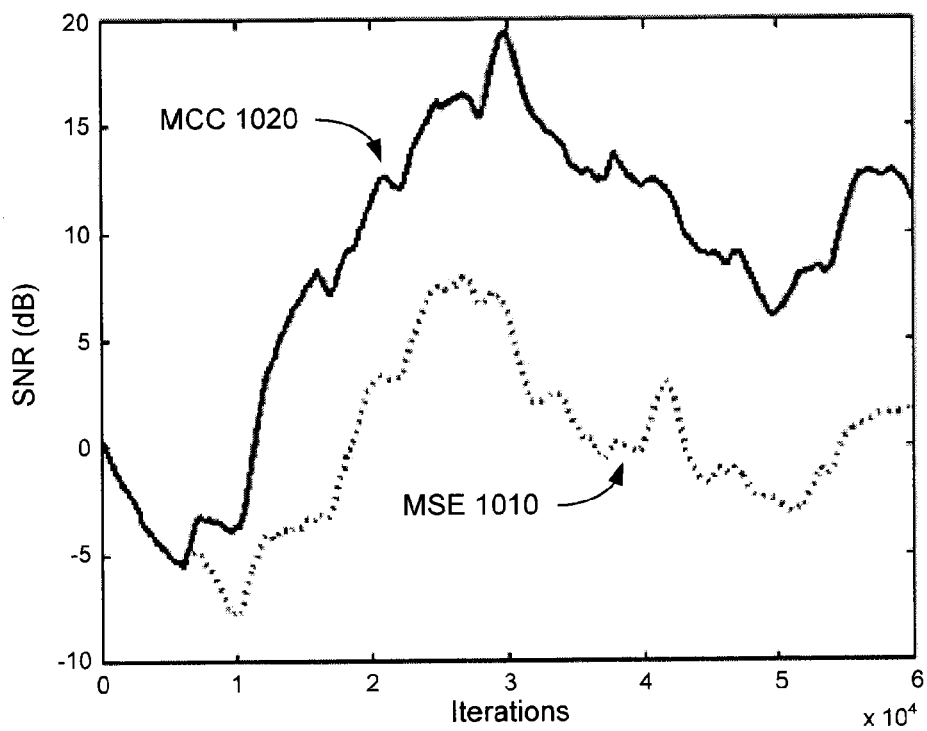
FIG. 10 is a graphical representation illustrating a non-limiting example of the SNR between an original speech signal and a cleaned signal with MSE and MCC in accordance with various embodiments of the present disclosure.

FIG. 10 shows a non-limiting example of the SNR between the original speech $n_i$ signal and the cleaned signal $e_i$ (after averaging over a moving window of 10,000 samples, for visual clarity). As can be seen by comparing the MSE SNR 1010 and the MCC SNR 1020 in FIG. 10, there is a substantial improvement in the SNR as obtained by MCC cost function and that obtained with the MSE cost function.

Echo Return Loss Enhancement (ERLE) is another measure of performance of an adaptive system 500 (FIG. 5) configured to cancel acoustic noise, and ERLE is more commonly used for echo cancellers. It measures the amount of noise (or echo) power that has been removed from the desired signal by subtracting the output of the adaptive filter 104. It is a ratio of the power of the desired signal and the error, expressed in decibels:

$$ERLE(db) = 10\log\left(\frac{E[d_i^2]}{E[e_i^2]}\right) \quad \text{EQ. (15)}$$

Figure 11:
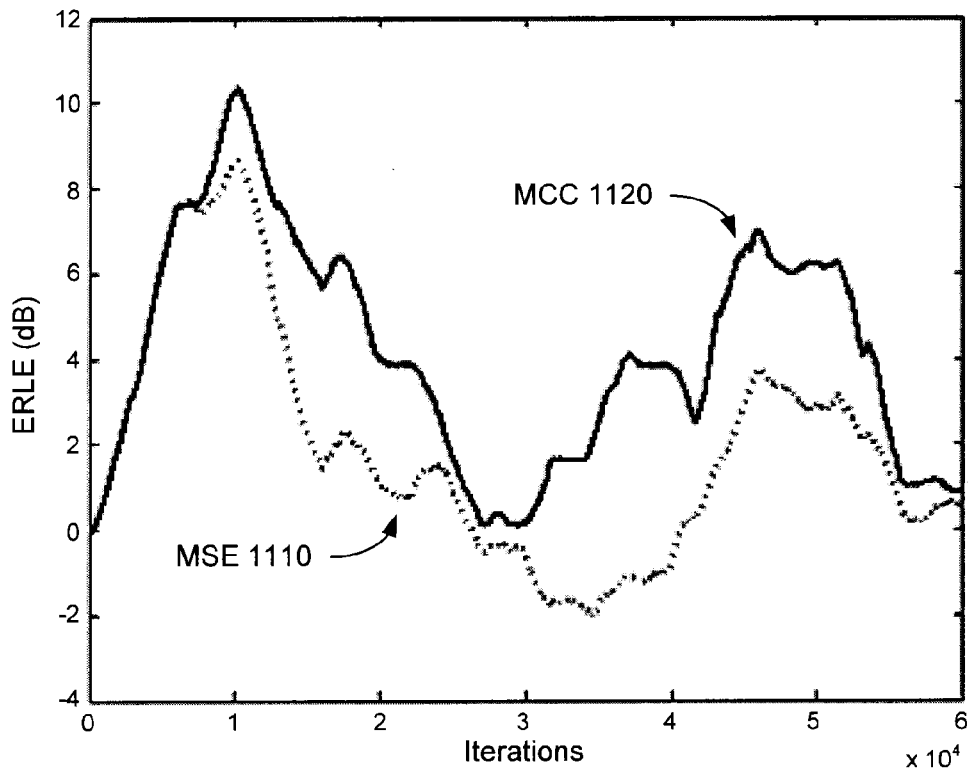
FIG. 11 is a graphical representation illustrating a non-limiting example of ERLE values of the MCC and MSE techniques in accordance with various embodiments of the present disclosure.

FIG. 11 shows a non-limiting example of ERLE values of the MCC and MSE techniques, after smoothing using a running window of 10,000 samples, for visual clarity. As can be seen by comparing the MSE ERLS track 1110 and the MCC ERLS track 1120 in FIG. 11, the MCC cost function is able to remove more noise power from the desired signal $d_i$ than the MSE cost function.

As demonstrated above, the MCC cost function is robust against outliers and impulsive characteristics in an error signal. This robustness is attained by weighting the errors $e_i$ with exponential functions, and the kernel size controls how this weighting is done. The kernel size σ effectively discriminates between large valued errors (outliers) and small errors, by weighting them differently. As σ→∞, this discriminability is lost, and the behavior of the MCC cost function approaches a MSE cost function. Therefore, it is reasonable to believe that any value of σ that is not very large is likely to result in a more robust algorithm than an MSE cost function. However, a very small kernel size can result in very small weighting being given to most of the error samples, in which case the learning rate of the weights would be very slow.

Figure 12:
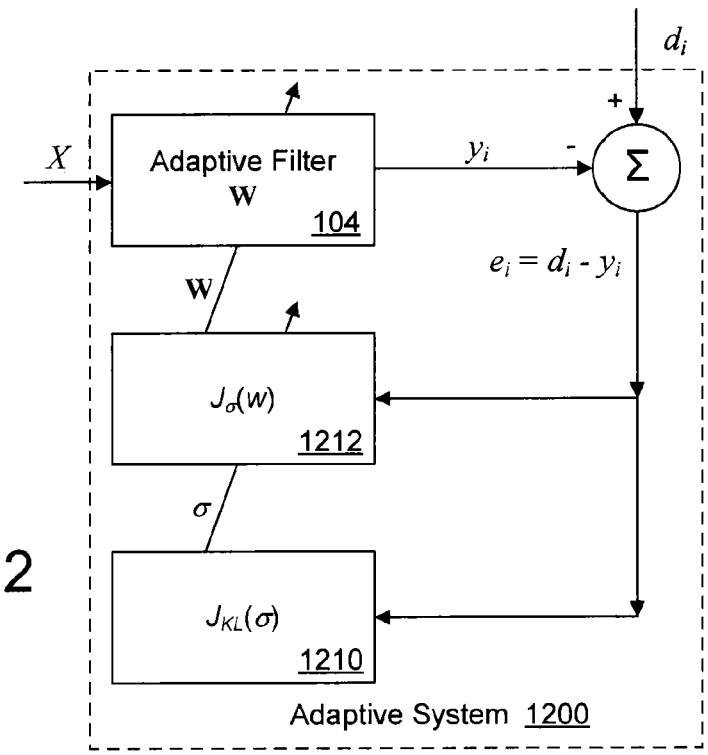
FIG. 12 is a block diagram of another example of an adaptive system including an adaptive kernel width in accordance with various embodiments of the present disclosure.

It is also possible to adapt the kernel width in a way that improves the performance of the MCC cost function. FIG. 12 illustrates an embodiment of an adaptive system 1200 including an MCC cost function with an adaptive kernel width 1210 and parameter learning 1212. To formulate such an adaptive kernel width, the Kullback-Leibler (KL) divergence between the density of the error samples estimated using the kernel and the true density is computed. KL divergence or "discriminant information" is the amount of information in a function $f$ for discriminating against another function $g$, and KL divergence is defined as:

$$D_{KL}(f\|g) = \int f(x)\log\left(\frac{f(x)}{g(x)}\right)dx \quad \text{EQ. (16)}$$

In an adaptive filter configuration, $\hat{f}_\sigma(e)$ is defined to be the estimated density function of a window of N samples of the error, evaluated using Gaussian kernel with kernel size σ:

$$\hat{f}_\sigma(e) = \frac{1}{N}\sum_{i=1}^{N} G_\sigma(e - e_i) \quad \text{EQ. (17)}$$

Substituting the true density function $f_o(e)$ for the function $f(x)$ and the estimated density function $\hat{f}_o(e)$ for $g(x)$ in the KL divergence equation and simplifying the equation further, $$D_{KL}(f\|\hat{f}_\sigma) = \int f(e)\log\left(\frac{f(e)}{\hat{f}_\sigma(e)}\right)de \quad \text{EQ. (18)}$$

$$D_{KL}(f\|\hat{f}_\sigma) = \int f(e)\log(f(e))de - \int \log(\hat{f}_\sigma(e))f(e)de \quad \text{EQ. (19)}$$

$$D_{KL}(f\|\hat{f}_\sigma) = \int f(e)\log(f(e))de - \int \log(\hat{f}_\sigma(e))f(e)de \quad \text{EQ. (20)}$$

The first term in EQ. (20) is independent of the kernel width. Therefore, minimizing $D_{KL}(f\|\hat{f}_o)$ with respect to σ is equivalent to maximizing the second term of EQ. (20). Therefore, the improved MCC cost function including an adapted kernel width is:

$$J_{KL}(\sigma) = E[\log(\hat{f}_\sigma(e))] \quad \text{EQ. (21)}$$

This is also the cross entropy of the estimated density function, by using the true density function to compute the expected value. Using the simple estimator for the expectation operator, and using EQ. (17), $$\hat{J}_{KL}(\sigma) = \frac{1}{N}\sum_{i=1}^{N}\log\left(\frac{1}{N-1}\sum_{j=1, j\neq i}^{N} G_\sigma(e_i - e_j)\right) \quad \text{EQ. (22)}$$

Therefore, a log-likelihood based cross validatory cost function can be obtained by minimizing the KL divergence between the true and estimated densities. The KL divergence may be considered minimized when compared to a predefined threshold. Taking the derivative of $J_{KL}(\sigma)$ with respect to σ yields, $$\frac{\partial J_{KL}(\sigma)}{\partial \sigma} = E\left[\frac{\frac{\partial \hat{f}_\sigma(e)}{\partial \sigma}}{\hat{f}_\sigma(e)}\right] \quad \text{EQ. (23)}$$

$$\frac{\partial J_{KL}(\sigma)}{\partial \sigma} = E\left[\frac{\sum_{i=n-L}^{n-1}\exp\left(\frac{-(e-e_i)^2}{2\sigma^2}\right)\left(\frac{(e-e_i)^2}{\sigma^3} - \frac{1}{\sigma}\right)}{\sum_{i=n-L}^{n-1}\exp\left(\frac{-(e-e_i)^2}{2\sigma^2}\right)}\right] \quad \text{EQ. (24)}$$

Going back to the original adaptive filter configuration, using the above equation we can formulate a simple gradient ascent-based search rule for the adapted kernel width 1210 to update the kernel size, at every weight update step of the adaptive filter. Therefore, $$\sigma_{n+1} = \sigma_n + \eta \frac{\partial J_{KL}(\sigma)}{\partial \sigma} \qquad \text{EQ. (25)}$$

$$\sigma_{n+1} = \sigma_n + \eta E\left[\frac{\sum_{i=n-L}^{n-1}\exp\left(\frac{-(e-e_i)^2}{2\sigma_n^2}\right)\left(\frac{(e-e_i)^2}{\sigma_n^3} - \frac{1}{\sigma_n}\right)}{\sum_{i=n-L}^{n-1}\exp\left(\frac{-(e-e_i)^2}{2\sigma_n^2}\right)}\right] \qquad \text{EQ. (26)}$$

The stochastic approximation of the gradient can be used by dropping the expectation operator and evaluating the operand at the current sample of the error. Therefore the final update equation becomes:

$$\sigma_{n+1} = \sigma_n + \eta\left[\frac{\sum_{i=n-L}^{n-1}\exp\left(\frac{-(e_n-e_i)^2}{2\sigma_n^2}\right)\left(\frac{(e_n-e_i)^2}{\sigma_n^3} - \frac{1}{\sigma_n}\right)}{\sum_{i=n-L}^{n-1}\exp\left(\frac{-(e_n-e_i)^2}{2\sigma_n^2}\right)}\right] \qquad \text{EQ. (27)}$$

The computational complexity of this adaptation technique, per iteration, is O(L), where L is the length of the window used for computing the density estimate. L should be selected to appropriately estimate the error dynamics for the application. A special case of the above update rule arises when L=1, in which case the equation takes the simple form, $$\sigma_{n+1} = \sigma_n + \eta\left(\frac{(e_n - e_{n-1i})^2}{\sigma_n^3} - \frac{1}{\sigma_n}\right) \qquad \text{EQ. (28)}$$

This simplified form has been experimentally shown to be sufficient in many practical applications.

Although the stochastic gradient approximation of EQ. (27) reduces computational complexity as compared to EQ. (26), it is more easily affected by an outlier in the data. If $e_n$ is an outlier in the stochastic gradient of EQ. (27), the denominator in the gradient diminishes, causing a "jump" in adaptation. In practice, this effect can be alleviated by having a small regularization constant, $\epsilon$, added to the denominator.

The kernel width update equation of EQ. (27) can potentially be used to update the MCC cost function of the adaptive system before updating the system parameters. Therefore, before each weight update step, we also update the kernel width with the adapted kernel width 1210. The weight update is performed by the parameter learning 1212, after incorporating the new kernel width, at each iteration. An embodiment of the adaptive system 1200 is illustrated in FIG. 12.

Such a configuration was tested on an example of a system identification problem. The input (X) to the plant and the adaptive filter was unit variance white Gaussian signal. For the first 800 samples (or iterations), the coefficients of the plant were chosen to be:

$$W^* = 3*[0.1, 0.5, 0.3, 0.2]^T \qquad \text{EQ. (29)}$$

After 800 samples, the coefficients of the plant were changed to be:

$$W^* = 0.5*[0.1, 0.5, 0.3, 0.2]^T \qquad \text{EQ. (30)}$$

For the experiment, this allows one to see how quickly the system adapts to new weights, for various kernel widths. To create non-Gaussian errors, the following is added as observation noise:

$$0.95N(0, 10^{-4}) + 0.05N(0, 5) \qquad \text{EQ. (31)}$$

Figure 13:
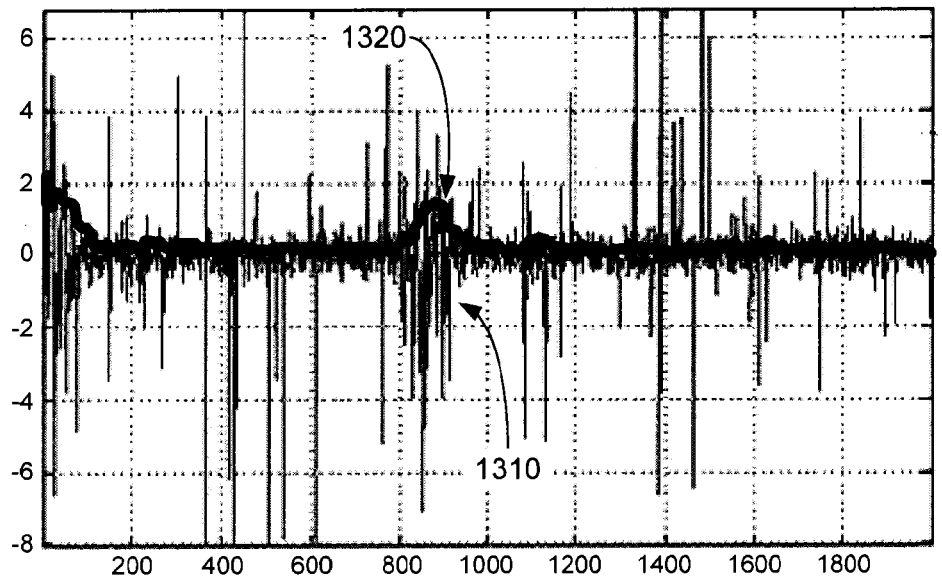
FIG. 13 is a graphical representation illustrating a non-limiting example of the errors and kernel size that are produced in the adaptive system of FIG. 12 in accordance with various embodiments of the present disclosure.

FIG. 13 shows a non-limiting example of the errors 1310 that are produced in the adaptive filter setting as described above. It can be seen that the kernel width 1320 adapts to the values of the error 1310. When the weights of the plant are changed at the 800th iteration, large errors 1310 are produced. The kernel size 1320 also increases, and the filter 104 (FIG. 12) adapts, the errors 1310 become smaller, and the kernel width 1320 also anneals.

Figure 14:
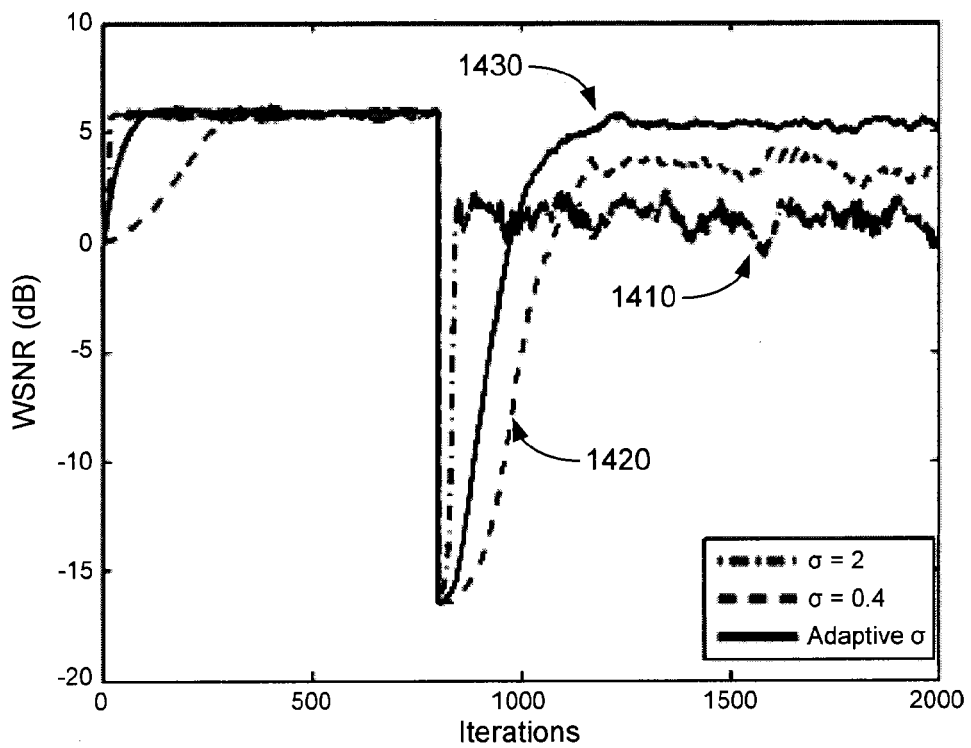
FIG. 14 is a graphical representation illustrating a non-limiting example of the Weight SNR plots obtained using an MCC cost function with different values of the kernel size in accordance with various embodiments of the present disclosure.

FIG. 14 shows a non-limiting example of the Weight SNR plots obtained using the MCC cost function with different values of the kernel size. As indicated by plot 1410, a relatively large kernel size such as $\sigma=2$, for example, helps in faster learning, but the robustness to outliers reduces and therefore the weights get affected by them, resulting in lower WSNR values. A small kernel size like $\sigma=0.4$ effectively creates a very narrow cost function to adapt on. Therefore, as shown by plot 1420, when the system is away from the optimal solution, the adaptation rate is very slow. The adaptive kernel size is able to strike an effective compromise between the two scenarios as illustrated by plot 1430.

Other ways have been proposed to address non-Guassian errors. For example, optimization of information theoretic quantities like entropy of the error have also been proposed as training principles, and their superiority over the conventional MSE cost function has been demonstrated. However, the computational complexity of those methods is high.

In contrast, the computational complexity of the correntropy cost function is simpler than the other methods and approximately the same as the MSE cost function. Therefore, an adaptive system implementing a correntropy cost function may be a practical way of adapting filters in real life situations, without making assumptions about the nature or statistics of the error signal $e_i$. Moreover, the correntropy cost function is useful for non-Guassian errors, whereas the MSE cost function is only effective for Guassian errors.

Figure 15:
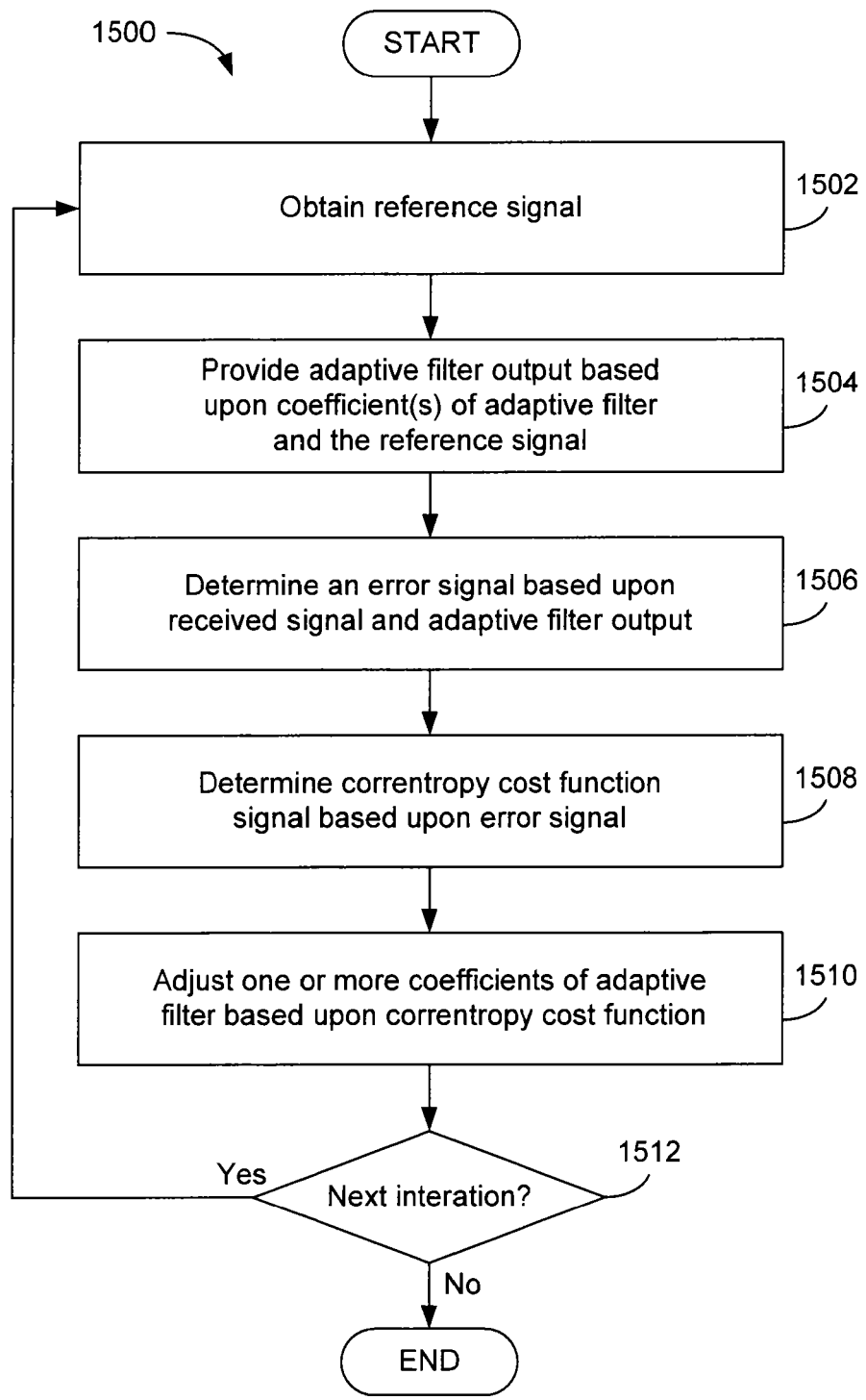
FIG. 15 is a flow chart illustrating an example of adaptive filtering using correntropy in accordance with various embodiments of the present disclosure.

Referring next to FIG. 15, shown is a flow chart 1500 illustrating an example of adaptive filtering using correntropy in accordance with various embodiments of the present disclosure. Initially, a reference signal is obtained in block 1502. For example, the reference signal (e.g., white noise) may be an input signal to an unknown plant or noise from a secondary source (e.g., noise from an automobile, vacuum cleaner, or another individual). In block 1504, an adaptive filter output is provided based at least in part upon one or more coefficients (or weights) of an adaptive filter and the reference signal. An error signal is determined in block 1506 based at least in part upon a received signal and the adaptive filter output. The received signal may be a desired signal including a filtered reference signal $s_i$ and a primary signal $n_i$. For example, the received signal may include, but is not limited to, the output of the unknown plant and observation noise or speech, music, etc. corrupted by an acoustic noise signal such as, e.g., noise from a vacuum cleaner that is affected by the acoustic transfer function of a room or road and/or engine noise that is affected by the acoustic transfer function of an automobile.

A correntropy cost function signal may be determined in block 1508. In some implementations, the correntropy cost function signal may be used to determine if one or more coefficients (or weights) of an adaptive filter should be adjusted based upon a comparison with a predefined threshold. For example, if correntropy cost function signal is exceeds the threshold, than the coefficient(s) may be incrementally adjusted. One or more of the coefficients of the adaptive filter may be adjusted based at least in part upon the correntropy cost function in block 1510. The coefficient(s) of the adaptive filter may be adjusted based at least in part upon a positive gradient of the correntropy cost function. The error signal of block 1506 may be used to an adjustment for a step size. If it is determined in block 1512 that another iteration should be performed, the adaptive filtering returns to block 1502 where another reference signal is obtained and used to provide an adaptive filter output in block 1504 based at least in part upon the adjusted filter coefficients.

The systems and methods provided herein can be implemented in hardware, software, firmware, or a combination thereof. In one embodiment, the method can be implemented in software or firmware that is stored in a memory and that is executed by a suitable instruction execution system. If implemented in hardware, as in an alternative embodiment, the system can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), digital signal processor (DSP), etc.

Figure 16:
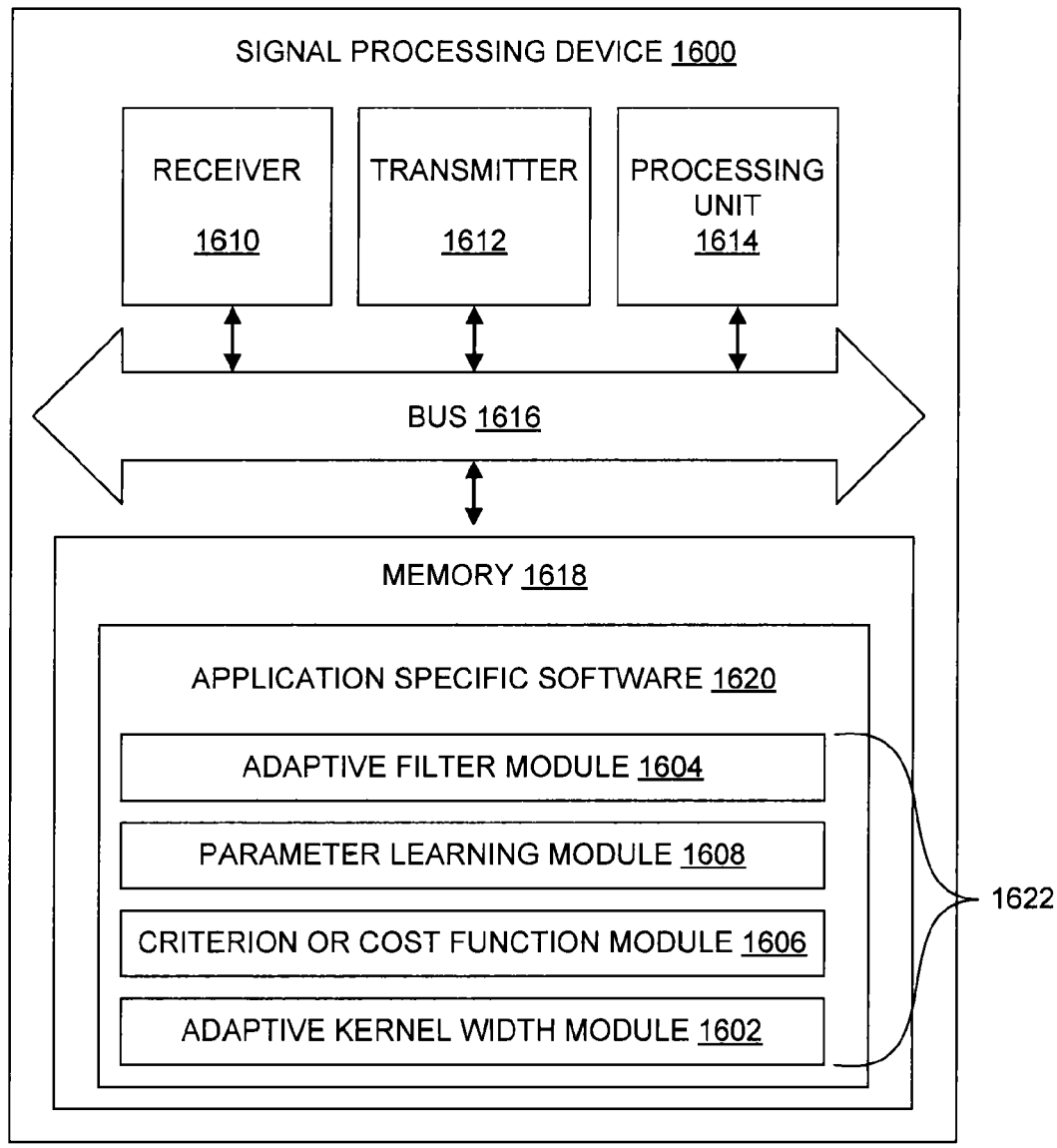
FIG. 16 is a graphical representation illustrating an example of a signal processing device in accordance with various embodiments of the present disclosure.

In some embodiments, the adaptive systems described above may be implemented in a signal processing device 1600 such as the one illustrated in FIG. 16. The signal processing device 1600 includes a receiver 1610, transmitter 1612, processing unit 1614, a bus 1616 and a memory 1618. The memory 1618 stores an application specific software 1620 including modules 1622, which include instructions that when executed by the processing unit 1614 perform various operations. As illustrated in FIG. 16, the modules 1622 may be, for example, an adaptive filter module 1604, a parameter learning module 1608, a criterion or cost function module 1606, and an adaptive kernel width module 1602. In some embodiments, the various modules 1622 may correspond to the blocks shown in the adaptive systems of FIGS. 1, 2, 5, and/or 12.

The flow chart of FIG. 15 shows the architecture, functionality, and operation of a possible implementation of the adaptive filtering software 1622. In this regard, each block represents a module, segment, or portion of code, which comprises one or more executable instructions for implementing the specified logical function(s). It should also be noted that in some alternative implementations, the functions noted in the blocks may occur out of the order noted in FIG. 15. For example, two blocks shown in succession in FIG. 15 may in fact be executed substantially concurrently or the blocks may sometimes be executed in the reverse order, depending upon the functionality involved, as will be further clarified hereinbelow.

The application specific software 1620 can also be stored on a variety of computer-readable media for use by, or in connection with, a variety of computer-related systems or methods. In the context of this disclosure, a "computer-readable medium" stores, communicates, propagates, or transports the program for use by or in connection with the instruction execution system, apparatus, or device. The computer readable medium can be, for example, but not limited to, an electronic, magnetic, optical, electromagnetic, infrared, or semiconductor system, apparatus, or device. More specific examples (a non-exhaustive list) of the computer-readable medium may include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), a portable compact disc read-only memory (CDROM) (optical), a digital versatile disc (optical), a high definition digital versatile disc (optical), and a Blu-ray Disc (optical).

Any process descriptions or blocks should be understood as representing modules, segments, or portions of code which include one or more executable instructions for implementing specific logical functions or steps in the process, and alternate implementations are included within the scope of the embodiments described in the present disclosure in which functions may be executed out of order from that shown or discussed, including substantially concurrently or in reverse order, depending on the functionality involved, as would be understood by those reasonably skilled in the art of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A signal processing device, comprising:
at least one processing unit; and
a memory storing an adaptive system executable in the at least one processing unit, the adaptive system comprising modules that when executed by the at least one processing unit cause the signal processing device to adaptively filter a desired signal using a correntropy cost function, wherein the correntropy cost function includes a scaling factor that is an exponential function of an error signal.

2. The signal processing device of claim 1, wherein the adaptive system comprises:
an adaptive filter module including a set of filter weights, the adaptive filter configured to provide an adaptive filter output signal based at least in part upon the set of filter weights and a reference signal; and
a parameter learning module configured to adjust the set of filter weights based at least in part upon the correntropy cost function and the error signal based at least in part upon the difference between the desired signal and the adaptive filter output signal.

3. The signal processing device of claim 2, wherein the adaptive system adjusts the set of filter weights based upon the error signal associated with the previous filter weight adjustment.

4. The signal processing device of claim 2, wherein the adaptive system iteratively adjusts the set of filter weights based upon a series of previous error signals, each error signal associated with one of a series of previous filter weight adjustments.

5. The signal processing device of claim 4, wherein the adaptive system iteratively adjusts the set of filter weights at least in part by applying, during an iteration of the iteratively adjusting and in the correntropy cost function, an error signal for the iteration in the exponential function.

6. The signal processing device of claim 2, further configured to obtain the desired signal and the reference signal.

7. The signal processing device of claim 2, wherein the reference signal is noise from a secondary source and the desired signal comprises speech and acoustic noise from the secondary source.

8. The signal processing device of claim 2, wherein the reference signal is an input signal to an unknown plant and the desired signal comprises observation noise and an output signal from the unknown plant.

9. The signal processing device of claim 1, wherein the signal processing device is a cellular telephone.

10. A method, comprising:
adjusting, by a signal processing device, a coefficient of an adaptive filter based at least in part on a correntropy cost function signal, wherein adjusting the coefficient of the adaptive filter comprises performing the adjustment in a manner that rejects outlier values during the adjusting;
providing, by the signal processing device, an adaptive filter output signal based at least in part on the adjusted coefficient and a reference signal; and
determining, by the signal processing device, an error signal based at least in part on a received signal and the adaptive filter output signal.

11. The method of claim 10, wherein the coefficient of the adaptive filter is adjusted based at least in part upon a positive gradient of the correntropy cost function.

12. The method of claim 11, wherein the coefficient of the adaptive filter is incrementally adjusted based at least in part upon the positive gradient of the cost function and a previously-determined error signal.

13. The method of claim 10, further comprising further adjusting coefficient of the adaptive filter based at least in part upon the determined error signal and a positive gradient of the correntropy cost function.

14. The method of claim 13, wherein the providing, determining, and further adjusting steps are iteratively repeated.

15. The method of claim 10, wherein the error signal is the difference between the received signal and the adaptive filter output signal.

16. The method of claim 13, wherein performing the adjustment in a manner that reduces an impact of outlier values comprises adjusting the coefficient based at least in part on scaling the correntropy cost function signal by an exponential function of the value of an error signal determined following an immediately-preceding iteration of the acts of providing and the determining.

17. The method of claim 10, wherein the coefficient of the adaptive filter is adjusted in response to a comparison of the correntropy cost function signal with a predetermined threshold.

18. The method of claim 17, wherein the coefficient of the adaptive filter is adjusted when the correntropy cost function signal exceeds the predetermined threshold.

19. A method of canceling noise, comprising:
modeling, by a signal processing device, a noise signal using a correntropy cost function, wherein the correntropy cost function includes a scaling factor that includes an exponential function performed on an error signal;
subtracting, by a signal processing device, the modeled noise signal from a received signal to yield a noise-free output signal; and
providing, by a signal processing device, the noise-free output signal.

20. The method of claim 19, wherein modeling the noise signal using the correntropy cost function comprises:
iteratively adjusting a set of filter coefficients of an adaptive filter based at least in part upon the correntropy cost function and the noise-free output signal at a previous interation; and
determining the noise signal based at least in part upon the set of adjusted filter coefficients and a current input noise signal.

21. The method of claim 20, wherein the set of filter coefficients is adjusted based at least in part upon a positive gradient of the correntropy cost function.

* * * * *

UNITED STATES PATENT AND TRADEMARK OFFICE
CERTIFICATE OF CORRECTION

PATENT NO. : 9,269,371 B2
APPLICATION NO. : 13/578358
DATED : February 23, 2016
INVENTOR(S) : Jose Carlos Principe et al.

Page 1 of 1

It is certified that error appears in the above-identified patent and that said Letters Patent is hereby corrected as shown below:

On the title page, Related U.S. Application Data, item (60) should read:

-- Provisional application No. 61/303,751, filed on Feb. 12, 2010. --

Signed and Sealed this
Twenty-sixth Day of July, 2016

Michelle K. Lee
*Director of the United States Patent and Trademark Office*